(12) United States Patent
Kuroda et al.

(10) Patent No.: US 8,584,350 B2
(45) Date of Patent: Nov. 19, 2013

(54) COMPONENT MOUNTING APPARATUS

(75) Inventors: Hideya Kuroda, Chiryu (JP); Yoshihiro Yasui, Chiryu (JP); Takayoshi Kawai, Chiryu (JP); Hiroyuki Haneda, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 129 days.

(21) Appl. No.: 13/159,971

(22) Filed: Jun. 14, 2011

(65) Prior Publication Data

US 2012/0020765 A1 Jan. 26, 2012

(30) Foreign Application Priority Data

Jul. 26, 2010 (JP) ................................. 2010-166661

(51) Int. Cl.
*H05K 13/04* (2006.01)
(52) U.S. Cl.
USPC .................... 29/739; 29/740; 29/741; 29/721; 29/832
(58) Field of Classification Search
USPC ........ 29/740–743, 830–834, 33 P; 414/752.1, 414/752.7; 198/346.2, 369.1
See application file for complete search history.

(56) References Cited

U.S. PATENT DOCUMENTS

| | | | |
|---|---|---|---|
| 6,378,198 B1 * | 4/2002 | Asai et al. ........................ | 29/825 |
| 6,729,017 B1 * | 5/2004 | Kashiwagi et al. ............. | 29/740 |
| 6,988,612 B1 * | 1/2006 | Kabeshita et al. ............. | 198/817 |
| 8,276,264 B2 * | 10/2012 | Shimizu et al. ................. | 29/739 |
| 2004/0128827 A1 | 7/2004 | Shimizu et al. | |
| 2010/0050426 A1 | 3/2010 | Shimizu et al. | |
| 2012/0020765 A1 * | 1/2012 | Kuroda et al. ............. | 414/749.1 |
| 2012/0227255 A1 * | 9/2012 | Shimizu et al. ................. | 29/739 |

FOREIGN PATENT DOCUMENTS

| | | |
|---|---|---|
| JP | 2004-128400 | 4/2004 |
| JP | 2008-28262 | 2/2008 |

* cited by examiner

*Primary Examiner* — Minh Trinh
(74) *Attorney, Agent, or Firm* — Oblon, Spivak, McClelland, Maier & Neustadt, L.L.P.

(57) ABSTRACT

In a component mounting apparatus, when one of first and second board transfer devices is performing the unloading and loading of boards, a controller operates a component placing device to mount components on a first or second board loaded by the other board transfer device. Thus, it is possible to effectively utilize the time which is taken for the unloading and the loading of either boards, for component mountings on the other board, so that the efficiency in producing boards can be enhanced. Further, since the controller executes a control so that while component mountings are performed on the first boards of M-sheets on the first board transfer device, component mountings are performed on the second boards of N-sheets on the second board transfer device, it is realized to suppress the occurrence of an intermediate stock of either boards where the first boards of the M-sheets and the second boards of the N-sheets are required.

8 Claims, 8 Drawing Sheets

COMPONENT MOUNTING APPARATUS

INCORPORATION BY REFERENCE

This application is based on and claims priority under 35 U.S.C. 119 with respect to Japanese Application No. 2010-166661 filed on Jul. 26, 2010, the entire content of which is incorporated herein by reference.

BACKGROUND OF THE INVENTION

1. Field of the Invention

The present invention relates to a component mounting apparatus for mounting components on a board.

2. Discussion of the Related Art

As electronic equipments, there is one in which respective sheets of boards different in kind are combined and arranged in one and the same product. Where components are to be mounted by a component mounting apparatus on such boards, it tends that an intermediate stock of boards in one kind increases due to difference in the combined numbers in sheet of different-kind boards as well as due to difference in the numbers or the like of components to be mounted on the respective kind boards. To avoid this drawback, in JP2008-28262 for example, there is disclosed a production control method in which boards of different kinds are respectively produced by a plurality of production lines and in which component mounting apparatuses in the respective production lines are controlled so that boards of different kinds required for one product are grouped and are produced as one board unit or group. According to the production method, since boards of one group are successively produced, it is possible to suppress the occurrence of an intermediate stock of the boards of a particular kind, but it is unable to enhance the efficiency in board production.

Further, in US 2004/0128827 A1 and its divisional application US 2010/0050426 A1 (equivalent of JP2004-128400 A) for example, there is disclosed a component mounting apparatus which is provided with two parallel-arranged board transfer devices and component placing heads, wherein the component placing heads operate in an alternate fashion to mount components on two boards transferred by the two board transfer devices and wherein while either one of the boards is being transferred after completion of component mounting operations, both of the component placing heads concentrically perform component mounting operations on the other board. According to the component mounting apparatus, the mountings of components on the other board are carried out efficiently, so that the efficiency in board production can be enhanced.

In the United States patent application publications, description has been made regarding the component mounting apparatus which mounts components on the other board while either one board is being transferred and which is thus capable of efficiently performing component mountings on the other board and hence of enhancing the efficiency in board production.

SUMMARY OF THE INVENTION

In the aforementioned United States patent application publications, however, nothing is described regarding a component mounting apparatus which is capable of suppressing the occurrence of an intermediate stock of boards of a particular kind where components are to be mounted on boards of different kinds which are combined with respective sheets of predetermined numbers.

Accordingly, it is an object of the present invention to provide an improved component mounting apparatus which is capable of suppressing the occurrence of an intermediate stock of boards of a particular kind where components are to be mounted on boards of different kinds which are combined with respective numbers of sheets, and hence, of enhancing the efficiency in board production.

Briefly, according to the present invention, there is provided a component mounting apparatus, which comprises a first board transfer device for loading and unloading first boards with a first component mounting position and a second board transfer device for loading and unloading second boards with a second component mounting position; a component supply device for supplying components of plural kinds to be mounted on the first boards and the second boards; a component placing device including a component placing head for picking up the components from the component supply device to mount the components on the first and second boards and a head moving mechanism for moving the component placing head in at least two directions parallel to surfaces of the first and second boards; and a controller for controlling operations of the first and second board transfer devices, the component supply device and the component placing device. Where component mountings are to be performed on the first and second boards at a rate of M-sheets to N-sheets differing from the M-sheets by performing loading and unloading of the first boards by the first board transfer device with the first component mounting position and loading and unloading of the second boards by the second board transfer device with the second component mounting position, the controller, when one of the first and second board transfer devices is performing the unloading and loading of the boards with an associated one of the first and second component mounting positions, operates the component placing device to mount components on the first or second board loaded by the other of the first and second board transfer devices to the other of the first and second component mounting positions. Further, the controller executes an M-to-N rate mounting control to operate the first and second board transfer devices and the component placing device so that while component mountings are performed on the first boards of the M-sheets at the first component mounting position, component mountings are performed on the second boards of the N-sheets at the second component mounting position.

With this construction, while performing the loading and unloading of either of the first boards and the second boards, the controller controls the component mountings on the other board. Thus, it is possible to effectively utilize the time which is taken for the loading and unloading of either of the first and second boards, and hence, the efficiency in mounting components on the other boards can be enhanced, so that the efficiency in board production can be enhanced. Further, since the controller executes the M-to-N rate mounting control in which the component mountings are carried out on the second boards of the N-sheets while the component mountings are carried out on the first boards of the M-sheets, it is possible to suppress the occurrence of an intermediate stock of either of the first and second boards where the first boards of the M-sheets and the second boards of the N-sheets are required as one unit or group.

BRIEF DESCRIPTION OF THE ACCOMPANYING DRAWINGS

The foregoing and other objects and many of the attendant advantages of the present invention may readily be appreciated as the same becomes better understood by reference to the preferred embodiment of the present invention when considered in connection with the accompanying drawings, wherein like reference numerals designate the same or corresponding parts throughout several views, and in which.

DETAILED DESCRIPTION OF THE PREFERRED EMBODIMENT

Figure 1:
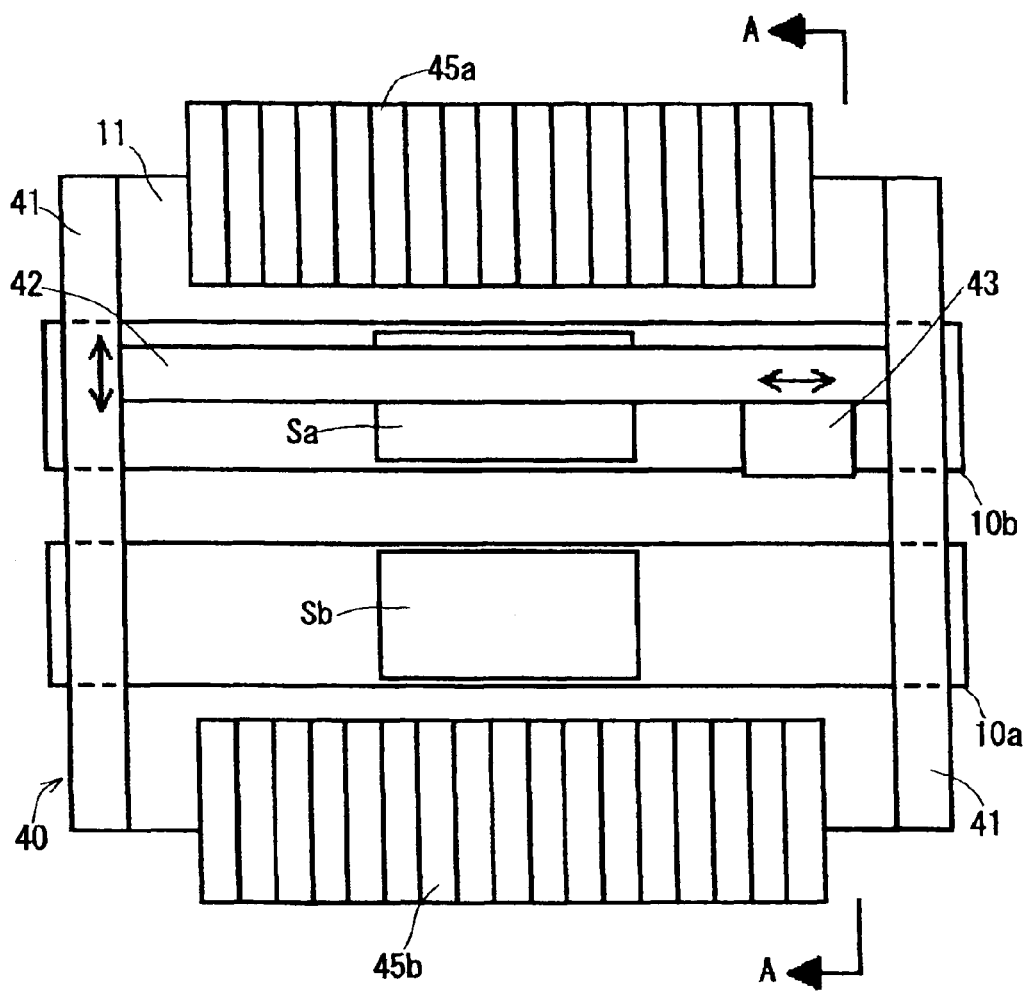
FIG. 1 is a schematic plan view showing the general construction of a component mounting apparatus in one embodiment according to the present invention.

Hereafter, a component mounting apparatus in one embodiment according to the present invention will be described with reference to the accompanying drawings. Referring now to FIG. 1, the component mounting apparatus is composed of first and second board transfer devices 10a, 10b, conveyor width adjusting devices 30 (FIG. 2) respectively associated with the board transfer devices 10a, 10b, a component placing device 40 and first and second component supply devices 45a, 45b.

Figure 2:
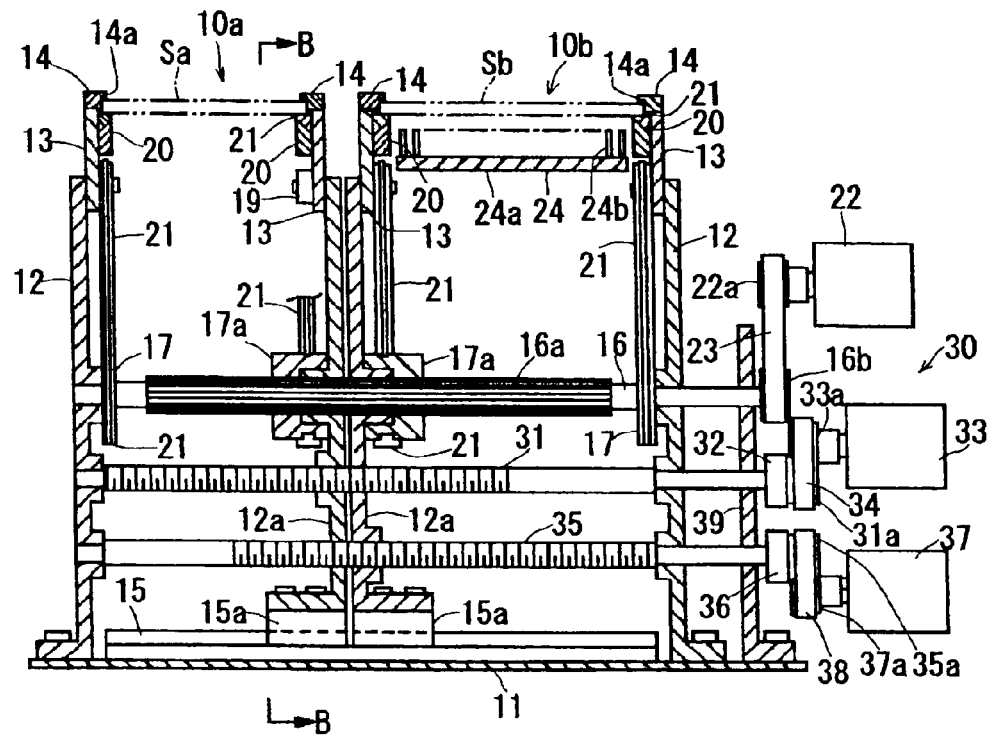
FIG. 2 is an enlarged cross-sectional view of first and second board transfer devices taken along the line A-A in FIG. 1.
Figure 3:
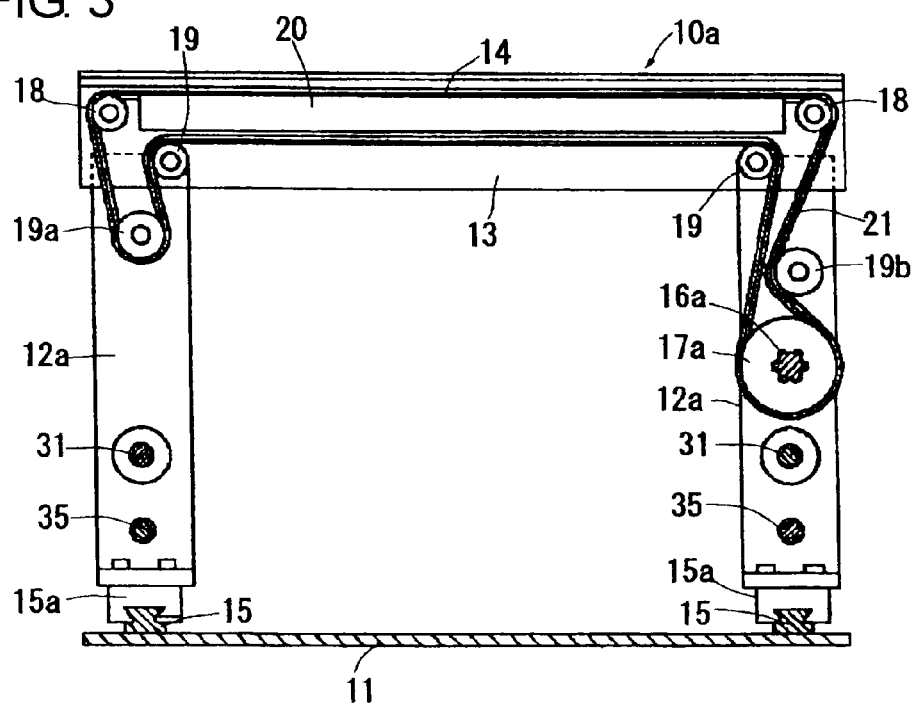
FIG. 3 is a longitudinal sectional view taken along the line B-B in FIG. 2.

The first and second board transfer devices 10a. 10b take substantially the same construction with each other, and therefore, the first board transfer device 10a will mainly be described for both of the transfer devices 10a, 10b. In the first board transfer device 10a, as shown in FIGS. 2 and 3, a pair of outside support pedestals 12 are upright fixed on a base 11, and a pair of inside support pedestals 12a which face the outside support pedestals 12, 12 are upright fixed respectively on sliders 15a which are guided and supported on the base 11 along guide rails 15 which extend perpendicularly to the outside support pedestals 12 so that the distance between the inside support pedestals 12a and the outside support pedestal 12 facing thereto are variable. A pair of support plates 13, 13 are secured respectively to upper inner surfaces of the support pedestals 12, 12a. A pair of side rails 14, 14 are fixed on the top surfaces of the support plates 13, 13 which project upward from the respective support pedestals 12, 12a. Upper edges of the side rails 14, 14 on the outside and inside are respectively formed with flange portions 14a which protrude inward toward each other. These flange portions 14a are respectively over support rails 20 which are respectively secured to the inner surfaces of the support plates 13, 13. The second board transfer device 10b is provided on the base 11 in parallel relation and symmetrically with the first board transfer device 10a, with a pair of inside support pedestals 12a adjoining to those of the first board transfer device 10a. Further, on the base 11, a support plate 39 is upright fixed on the outside of the outside support pedestals 12 of the second board transfer device 10b.

The opposite end portions of a transfer rotary shaft 16 which is arranged to extend perpendicularly of the support plate 13 are rotatably carried respectively in the outside support pedestals 12, 12 of the board transfer devices 10a, 10b. A spline shaft portion 16a which forms most of a middle portion of the transfer rotary shaft 16 passes through the inside support pedestals 12a, 12a rotatably and axially movably. Outside drive pulleys 17, 17 are secured respectively to the opposite end portions of the transfer rotary shaft 16 respectively adjoining to the outside support pedestals 12, 12. The inside support pedestals 12a, 12a are formed with boss portions, through which the spline shaft portion 16a passes, and inside drive pulleys 17a, 17a are carried respectively on the boss portions to be rotatable and not to be axially movable. The inside drive pulleys 17a, 17a are spline-engaged with the spline shaft portion 16a to be slidable thereon, so the rotation of the transfer rotary shaft 16 can be transmitted to the inside drive pulleys 17a, 17a.

As shown mainly in FIG. 3, the support plate 13 secured to the inside support pedestals 12a, 12a rotatably carries pairs of pulleys 18, 18, 19, 19 at opposite ends slightly below the side rail 14 and at lower inside portions, and pulleys 19a, 19b are rotatably supported under between the pulleys 18 and 19. An endless or loop conveyor belt 21 with a T-shape cross-section is wound between the inside drive pulley 17a and these pulleys 18, 18, 19, 19, 19a, 19b. Each of the pulleys 17a, 18, 18 and 19a is formed with a circumferential groove which is engageable complementarily with the T-shape cross-section of the conveyor belt 21 so as to prevent the same from coming off.

A part of each conveyor belt 21 extended between the pair of pulleys 18, 18 resides maintaining a constant distance or spacing from the flange portion 14a of the corresponding side rail 14. A longitudinal groove whose cross-section is complementarily fitted with the T-shape cross-section of the conveyor belt 21 is formed at the upper surface of the support rail 20 secured to the support plate 13 between the pulleys 18, 18 for supporting and guiding that part of the conveyor belt 21. Likewise, the support plate 13 secured to the outside support pedestals 12, 12 is provided with pulleys 18, 18, 19, 19, 19a, 19b respectively corresponding to those provided on the inside support pedestals 12a. A loop conveyor belt 21 is wound between the outside drive pulley 17 and these pulleys 18, 18, 19, 19, 19a, 19b, and a support rail 20 for supporting and guiding the conveyor belt 21 is provided on the support plate 13 secured to the outside support pedestals 12, 12.

One end of the transfer rotary shaft 16 goes to pass through one of the outside support pedestals 12 of the second board transfer device 10b, protrudes beyond the support plate 39 and has a pulley 16b secured to an extreme end thereof. A conveyor drive motor 22 is supported on the base 11 (the support structure omitted from illustration), and a drive belt 23 is provided between a pulley 22a secured to an output shaft of the conveyor drive motor 22 and the pulley 16b. Thus, the conveyor belts 21 are moved to circulate by driving the respective drive pulleys 17, 17, 17a, 17a through the transfer rotary shaft 16. The first and second board transfer devices 10a, 10b as constructed above constitute two conveyors of a linear transfer type which respectively load first and second boards Sa, Sb in the component mounting apparatus or unload the same therefrom.

Between the inside and outside support rails 20, 20 at the upper part of each of the first and second board transfer devices 10a, 10b, there is provided a backup device 24, which comprises a backup plate 24a being movable up and down by a lifting device (not shown) and a plurality of backup pins 24b upright fixed on the backup plate 24a. The backup device 24 illustrated is not able to vary the width in a direction orthogonal to the transfer direction, and therefore, the backup plate 24a is to be replaced each time the width in the direction orthogonal to the transfer direction of each board transfer device 10a, 10b is varied by the conveyor width adjusting device 30, referred to later in detail. However, the backup device 24 is not limited to that of a fixed width type and may be one whose width can be varied automatically in connection with the operation of the conveyor width adjusting device 30, so that it becomes unnecessary to replace the backup device 24 each time the width of each board transfer device 10a, 10b is varied. Although for brevity in illustration, FIG. 2 only shows the backup device 24 for the second board transfer device 10b, it is to be noted that the backup device 24 is also provided in the first board transfer device 10a.

The first and second boards Sa, Sb are loaded into and unloaded from the component mounting apparatus with both side edges thereof being supported by the respective pairs of the conveyor belts 21, 21, 21, 21 of the first and second board transfer devices 10a, 10b. After being transferred to respective predetermined positions, the boards Sa, Sb are lifted up with elevation of the backup devices 24 and are positioned to first and second component mounting positions as a result of being brought into abutting engagement with the flange portion 14a of each side rail 14. In this particular embodiment, the transfer rotary shaft 16 is used in common to both of the first and second board transfer devices 10a, 10b and is rotated to simultaneously drive the conveyor belts 21 of the both transfer devices 10a, 10b. However, a drive device for the conveyor belts 21 is not limited to this type. Respective transfer rotary shafts 16 may be provided for the first and second board transfer devices 10a, 10b and may be rotated by individual conveyor drive motors 22. In the case of being so modified, it becomes realized to drive the conveyor belts 21, 21 of the both transfer devices 10a, 10b independently of each other. In this modified case, the respective transfer rotary shafts 16, 16 can be provided being carried respectively on the support pedestals 12a, 12a which are spaced in the transfer direction. Moreover, in the illustrated embodiment, it is possible to transfer the first and second boards Sa, Sb independently of each other. That is, when the unloading and loading of boards are to be carried out on only one of the first and second board transfer devices 10a, 10b, the backup device 24 is lifted up to release a board on the other board transfer device from contacts with the loop belts 21 and to lock the board on the flange portions 14a of the side rails 14, so that the board locked on the other board transfer device remains while one board transfer device is performing the loading and unloading of the boards thereon. Therefore, as described later in detail, during the component mounting operations on a board locked by the backup device 24 on one board transfer device 10a (or 10b), it becomes possible to perform the unloading and loading of boards on the other board transfer device 10b (or 10a).

Next, the conveyor width adjusting devices 30 will be described. As shown in FIGS. 2 and 3, a pair of first screw shafts 31, 31 arranged in parallel to the transfer rotary shaft 16 are provided for altering the distance between the both of the support pedestals 12, 12a of the first board transfer device 10a and hence, the distance between the support plates 13, 13 secured to the support pedestals 12, 12a. Each of the first screw shafts 31 is rotatably carried at its opposite ends in the outside support pedestals 12, 12 of the first and second board transfer devices 10a, 10b and rotatably and axially movably passes at its middle portion through the inside support pedestal 12a of the second board transfer device 10b. A threaded portion of each screw shafts 31 which is formed mainly on the side of the first board transfer device 10a is screw-engaged with a boss portion which is formed on the inside support pedestal 12a of the first board transfer device 10a.

Passing through the corresponding outside support pedestal 12 of the second board transfer device 10b, one end of each first screw shaft 31 is protruded from the support plate 39 and has a pulley 31a secured thereto. The pulleys 31a, 31a of the both first screw shafts 31, 31 are in driving connection with each other with a connection belt 32 being wound between the half portions in the width direction thereof. A first drive motor 33 is supported (the support structure not shown) on the base 11, and a drive belt 34 is wound between a pulley 33a secured to an output shaft of the first drive motor 33 and the remaining half portion in the width direction of one of the pulleys 31a, 31a. Thus, the both first screw shafts 31, 31 are synchronously rotated by the first drive motor 33 thereby to alter the width of the first board transfer device 10a in the direction perpendicular to the transfer direction (i.e., the distance between the support plates 13 and 13 secured to the both support pedestals 12, 12a and hence, the distance between the side rails 14 and 14).

Another pair of second screw shafts 35, 35 arranged in parallel to the transfer rotary shaft 16 are provided for altering the distance between the both of the support pedestals 12, 12a of the second board transfer device 10b and hence, the distance between the support plates 13, 13 secured to the support pedestals 12, 12a. Each of the second screw shafts 35 is rotatably carried at its opposite ends in the outside support pedestals 12, 12 of the first and second board transfer devices 10a, 10b and rotatably and axially movably passes at its middle portion through the inside support pedestal 12a of the first board transfer device 10a. A threaded portion of each screw shaft 35 which is formed mainly on the side of the second board transfer device 10b is screw-engaged with a boss portion which is formed on the inside support pedestal 12a of the second board transfer device 10b. Other parts associated with the second screw shafts 35, 35 are a pulley 37a, respective pulleys 35a, 35a, a drive belt 38 and a connection belt 36, which are substantially the same in construction as those parts associated with the first screw shafts 31, 31. Thus, such other parts are omitted from being described in detail. Thus, with the rotation of a second drive motor 37, the both second screw shafts 35, 35 are rotated synchronously with each other, whereby the width of the second board transfer device 10b in a direction perpendicular to the transfer direction can be altered independently of that of the first board transfer device 10a.

In this particular embodiment, the respective inside support pedestals 12a, 12a of the first and second board transfer devices 10a, 10b are movable independently of each other with the respective outside support pedestals 12, 12 fixed on the base 11. However, the structure of the transfer devices 10a, 10b is not limited to this type. In one modified form, the respective inside support pedestals 12a, 12a may be fixed on the base 11, and instead, the respective outside support pedestals 12, 12 may be movable by the respective pairs of screw shafts 31, 35 independently of each other. In another modified form, the outside support pedestals 12 of one of the both board transfer devices 10a, 10b and the inside support pedestals 12a of the other board transfer device may be fixed on the base 11, and the remaining inside support pedestals 12a and the remaining outside pedestals 12 may be movable by the pairs of screw shafts 31, 35. In a further modified form, only one pair on one side of the outside support pedestals 12, 12 of the both board transfer devices 10a, 10b may be secured to the base 11, the two pairs of the inside support pedestals may be moved bodily by screw shafts, and the remaining pair of the outside support pedestals on the other side may be moved by other screw shafts independently of the two pairs of the inside support pedestals.

Next, the component placing device 40 will be described. As shown in FIG. 1, the component placing device 40 is composed of a pair of fixed rails 41, 41 which are supported on the base 11 in parallel relation with each other over the opposite ends of the both board transfer devices 10a, 10b in the transfer direction, a head guide rail 42 which is arranged perpendicularly to the fixed rails 41, 41 with both ends thereof supported to be movable along the fixed rails 41, 41 by feed screws (not shown) which are drivingly rotatable by servomotors (not shown), and a component placing head 43 which is supported to be movable along the head guide rail 42 by a feed screw (not shown) drivingly rotatable by a servomotor (not shown). The fixed rails 41, 41, the head guide rail 42, the respective servomotors and the respective feed screws constitute a head moving mechanism for feeding the component placing head 43 in two directions parallel to the component mounting surface (i.e., upper surface in this particular embodiment) of each board Sa, Sb.

The component placing head 43 is provided with a vertically movable suction nozzle (not shown) for drawing a component thereto. Movements of the head guide rail 42, the component placing head 43 and the suction nozzle are respectively controlled by servomotors (not shown), so that the suction nozzle successively draws plural components supplied from the component supply devices 45a, 45b described next and successively mounts the components one at a time on the respective boards Sa, Sb held at the component mounting positions on the board transfer devices 10a, 10b as described earlier.

Next, the component supply devices 45a, 45b will be described. As shown in FIG. 1, each of the component supply devices 45a, 45b is composed of a plurality of feeders juxtaposed on a feeder table which is fixed on the base 11 on a corresponding one of both sides in a direction perpendicular to the transfer direction. Each feeder is of a tape-feed type, for example. This tape-feed type feeder contains a slender tape which has enclosed components of a certain kind at a regular pitch or interval in such a way that the tape is wound about a supply reel, and is able to feed the components one by one to its extreme end close to the board transfer device 10a or 10b on the same side. Thus, each component fed to the extreme end of each feeder can be taken or picked up by the suction nozzle of the component placing head 43. The tape comprises a base tape retaining the components thereon and a cover tape covering the same. At the extreme end of each feeder, the cover tape is peeled off the base tape thereby to enable each component to be drawn by the suction nozzle, and the base tape is turned down to be wound on a take-up reel. Although in this particular embodiment, the component supply devices 45a, 45b are respectively provided on both outsides of the first and second board transfer devices 10a, 10b, namely one on each outside thereof, only one component supply device 45a or 45b may be provided outside either one of the board transfer devices 10a, 10b.

Figure 4:
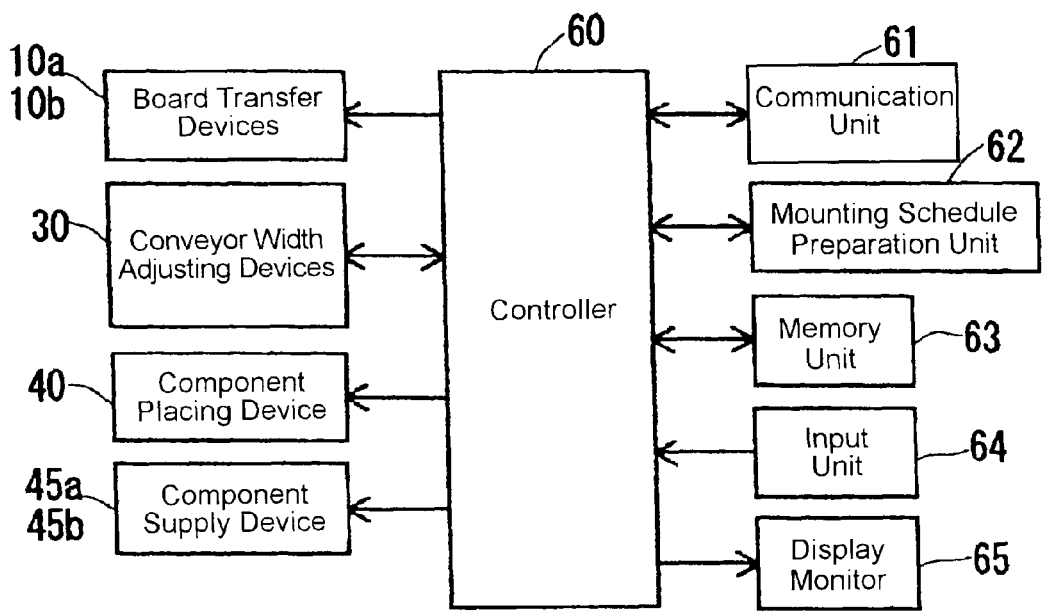
FIG. 4 is a block diagram showing a control system for the component mounting apparatus shown in FIG. 1.

The operation of the component mounting apparatus as described above is controlled by a controller 60 shown in FIG. 4. The controller 60 is connected to the first and second board transfer devices 10a, 10b, the conveyor width adjusting devices 30, the component placing device 40 and the component supply devices 45a, 45b. The controller 60 is further connected to a communication unit 61, a mounting schedule preparation unit 62, a memory unit 63, an input unit 64, and a display monitor 65. The communication unit 61 is operable to communicate with a host computer (not shown) which supervises a production line including the component mounting apparatus. Via the communication unit 61, mounting data for boards of respective kinds to be produced (i.e., the kinds of components to be mounted and mounting coordinates data therefor), component mounting sequence data (mounting order of components of each kind), production schedule data (i.e., data indicative of the production sequence and the number of sheets to be produced for each kind of boards) and the like are transmitted from the host computer to the component mounting apparatus.

The mounting schedule preparation unit 62 prepares a mounting program which is able to avoid such a situation that the production efficiency is lowered due to the first and second board transfer devices 10a, 10b both simultaneously transferring the first and second boards Sa, Sb, based on the mounting data for respective kinds of the products, the component mounting sequence data and the production schedule data which have been transmitted from the host computer. In a modified form of the embodiment, a mounting program preparation processing performed by the mounting schedule preparation unit 62 may be executed by the host computer, and the prepared mounting program may be transmitted to the component mounting apparatus. The memory unit 63 stores various programs, data and the like for the component mounting apparatus. The input unit 64 includes a keyboard, push buttons and the like for inputting necessary data and commands. The display monitor 65 comprises a display device such as LCD, CRT or the like for displaying necessary information.

Next, the operation of the component mounting apparatus as constructed above will be described taking as example a case that component mountings carried out on the first board Sa and the second board Sb which are different kinds of boards to be arranged in one and the same product in combination of respective numbers of sheets. Where component mountings are to be carried out on the first boards Sa and the second boards Sb at a different rate of M-sheets to N-sheets differing from the M-sheets by loading and unloading the first boards Sa with a first component mounting position by the first board transfer device 10a, by loading and unloading the second boards Sb with a second component mounting position by the second board transfer device 10b, and by operating the component placing device 40, the controller 60 controls the first board transfer device 10a, the second board transfer device 10b, and the component placing device 40 to operate under an M-to-N rate mounting control.

Specifically, the controller 60 executes a control that when one of the first and second board transfer devices 10a, 10b is performing the unloading and loading of boards with the first or second component mounting position, the component placing device 40 performs component mountings on the first board Sa or the second board Sb which has already been loaded by the other of the first and second board transfer devices 10a, 10b to the first or the second component mounting position. Thus, the unloading and loading time period for the boards Sa or Sb can be utilized effectively, and the component mountings on the other board Sb or Sa can be carried out efficiently, so that it is possible to enhance the efficiency in producing the boards Sa and Sb. Further, the controller 60 controls component mountings to be carried out on the first boards Sa of M-sheets at the first component mounting position and, during the same period of time, to be carried out on the second boards Sb of N-sheets at the second component mounting position. Thus, where the M-sheets of the first boards Sa and the N-sheets of the second boards Sb are required for one product, it is possible to suppress the occurrence of an intermediate stock of either boards Sb or Sa.

A first M-to-N rate mounting control can be executed through the control of switching the priority state of component mountings on the first boards Sa and the priority state of component mountings on the second boards Sb based on production numbers of the first and second boards Sa, Sb. That is, the controller 60 individually prepares and executes as mounting programs a first board mounting program for controlling the component placing device 40 in mounting components on the first board Sa, a second board mounting program for controlling the component placing device 40 in mounting components on the second board Sa, and a priority mounting program for controlling the switching between the priority state of component mountings on the first boards Sa and the priority state of component mountings on the second boards Sb based on the respective production numbers of the first and second boards Sa, Sb. Each of the mounting programs does not include commands which control the first board transfer device 10a and the second board transfer device 10b in transferring the first board Sa and the second board Sb, and each board Sa, Sb on which mountings have been completed is automatically unloaded and each board Sa, Sb with no component mounted thereon is automatically loaded.

Figure 5:
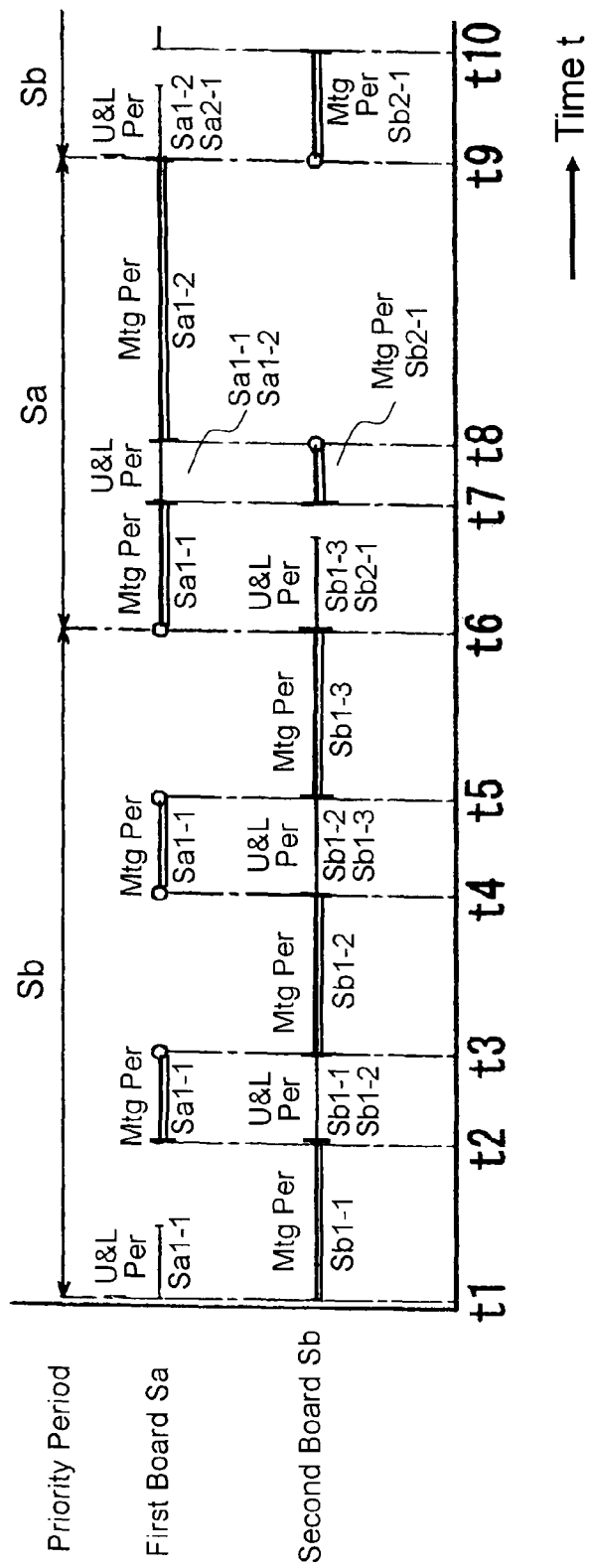
FIG. 5 is a time chart for explaining a first M-to-N mounting control executed by a controller shown in FIG. 4.
Figure 6:
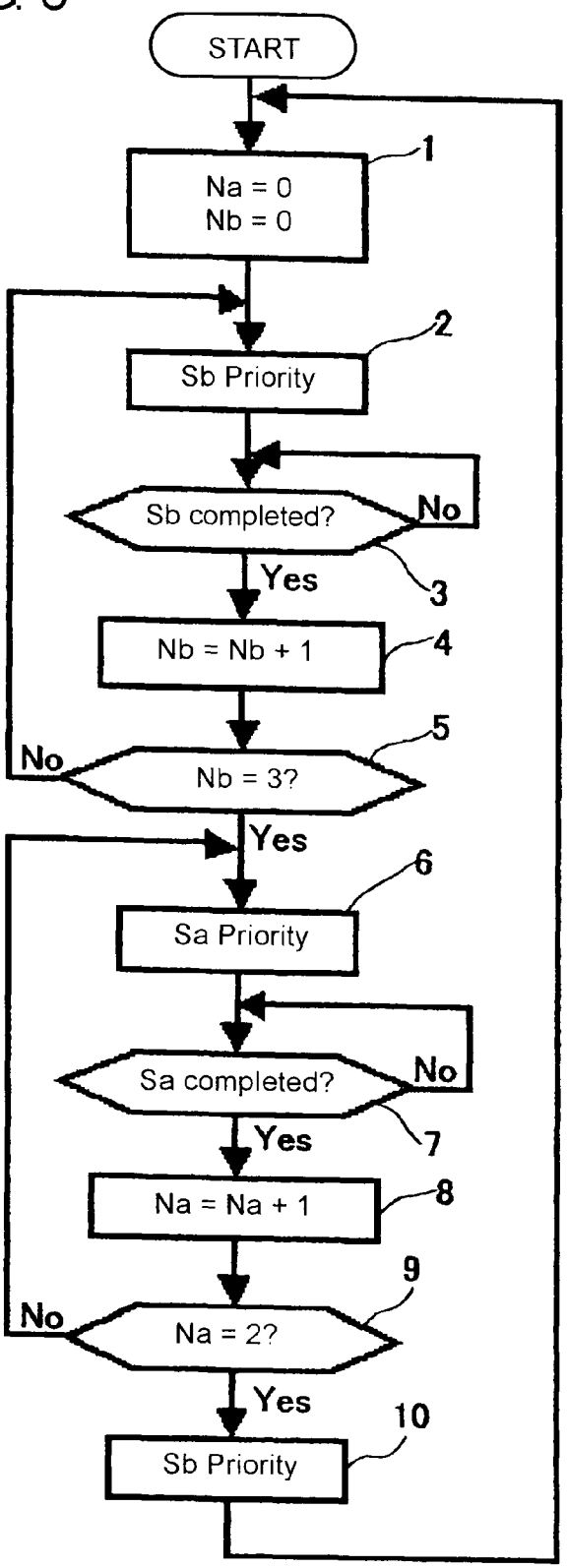
FIG. 6 is a flow chart for explaining the first M-to-N mounting control executed by the controller shown in FIG. 4.

With reference to a time chart shown in FIG. 5 and a flow chart shown in FIG. 6, the first M-to-N rate mounting control will be described hereafter taking as example a case that the number M of the first boards Sa on which components are to be mounted are two sheets while the number N of the second boards Sb on which components are to be mounted are three sheets. Counts Na, Nb respectively indicating sheet numbers of the first and second boards Sa, Sb are reset to "0" (step 1). When a first-sheet second board Sb in a first group (hereafter designated as Sb1-1) is loaded by the second board transfer device 10b to the second component mounting position, the component mountings on the second boards Sb are set to be placed in the priority state (step 2), and component mountings on the second board Sb1-1 are started by the component placing device 40 (time t1).

During the component mountings on the second board Sb1-1 (time t1-t2), a first-sheet first board Sa in a first group (hereafter designated as Sa1-1) is loaded by the first board transfer device 10a to the first component mounting position. Upon completion of the component mountings on the second board Sb1-1 (step 3, time t2), the same is unloaded by the second board transfer device 10b from the second component mounting position, and a second-sheet second board Sb in the first group (hereafter designated as Sb1-2) is loaded by the second board transfer device 10b to the second component mounting position. By utilizing the time period which is taken for the unloading and loading of the second boards Sb1-1, Sb1-2 on the priority side (time t2-t3), component mountings are carried out by the component placing device 40 on the first board Sa1-1 on the non-priority side which has already been loaded.

Then, "1" is added to the count Nb for the second boards Sb (step 4), and judgment is made as to where or not the count Nb for the second boards Sb has reached "3" (step 5). At this time, since the count Nb for the second boards Sb is "1" and has not reached "3", return is made to step 2 to continue the priority state of component mountings on the second boards Sb. When the loading of the second board Sb1-2 is completed (time t3), component mountings on the second board Sb1-2 on the priority side become possible, and thus, the component mountings on the first board Sa1-1 on the non-priority side are discontinued even in the mid course, wherein component mountings on the loaded second board Sb1-2 are started by the component placing device 40. It is to be noted that the discontinuation of the component mountings on the first board Sa1-1 on the non-priority side is not necessarily made immediately and instead, is desirably made upon completion of a series of cycles in which the component placing device 40 draws a component and completes the mounting of the same. Upon completion of the component mountings on the second board Sb1-2 (step 3, time t4), the same is unloaded by the second board transfer device 10b from the second component mounting position, and a third-sheet second board Sb in the first group (hereafter designated as Sb1-3) is loaded by the second board transfer device 10b to the second component mounting position. During the unloading and loading of the second-sheet and third-sheet second boards Sb1-2, Sb1-3 (time t4-t5), the component mountings on the first board Sa1-1 which is held in the mid course of the component mountings are resumed to be executed by the component placing device 40.

Then, "1" is added to the count Nb for the second boards Sb (step 4), and judgment is made as to where or not the count Nb for the second boards Sb has reached "3" (step 5). At this time, since the count Nb for the second boards Sb is "2" and has not reached "3", return is made to step 2 to continue the priority state of component mountings on the second boards Sb. When the loading of the second board Sb1-3 is completed (time t5), the component mountings on the first board Sa1-1 are discontinued even in the mid course, and component mountings on the loaded second board Sb1-3 are started by the component placing device 40. Upon completion of the component mountings on the second board Sb1-3 (step 3, time t6), the same is unloaded by the second board transfer device 10b from the second component mounting position, and a first-sheet second board Sb in the next or second group (hereafter designated as Sb2-1) is loaded by the second board transfer device 10b to the second component mounting position.

During the unloading and loading of the second boards Sb1-3, Sb2-1 (time t6-t7), the component mountings on the first board Sa1-1 which is held in the mid course of the component mountings are resumed to be executed by the component placing device 40. Then, "1" is added to the count Nb for the second boards Sb (step 4), and judgment is made as to where or not the count Nb for the second boards Sb has reached "3" (step 5). At this time, since the count Nb for the second boards Sb has reached "3", the processing is advanced to step 6 to switch from the priority state of the component mountings on the second boards Sb to the priority state of the component mountings on the first boards Sa. As a result, even when the loading of the first-sheet second board Sb2-1 in the second group has been completed, the component mountings on the first board Sa1-1 are continued until all of programmed or scheduled components are mounted thereon.

Subsequently, when the component mountings on the first board Sa1-1 are completed (step 7, time t7), the same is unloaded by the first board transfer device 10a from the first component mounting position, and a second-sheet first board Sa in the first group (hereafter designated as Sa1-2) is loaded by the first board transfer device 10a to the first component mounting position. During the unloading and loading of the first boards Sa1-1, Sa1-2 (time t7-t8), the component mountings on the loaded second board Sb2-1 are carried out by the component placing device 40. Then, "1" is added to the count Na for the first boards Sa (step 8), and judgment is made as to where or not the count Na for the first boards Sa has reached "2" (step 9). At this time, since the count Na for the first boards Sa is "1" and has not reached "2", return is made to step 6 to continue the priority state of component mountings on the first boards Sa.

When the loading of the first board Sa1-2 is completed (time t8), the component mountings on the second board Sb2-1 are discontinued even in the mid course, and the component mountings on the loaded first board Sa1-2 are carried out by the component placing device 40 until all of programmed or scheduled components are mounted thereon. When the component mountings on the first board Sa1-2 are completed (step 7, time t9), the same is unloaded by the first board transfer device 10a from the first component mounting position, and a first-sheet first board Sa in the next or second group (hereafter designated as Sa2-1) is loaded by the first board transfer device 10a to the first component mounting position.

During the unloading and loading of the first boards Sa1-2, Sa2-1 (time t9-t10), the component mountings on the second board Sb2-1 which is held in the mid course of the component mountings are resumed to be executed by the component placing device 40. Then, "1" is added to the count Na for the first boards Sa (step 8), and judgment is made as to where or not the count Na for the first boards Sa has reached "2" (step 9). At this time, since the count Na for the first boards Sa has reached "2", the processing is advanced to step 10 to switch from the priority state of the component mountings on the first boards Sa to the priority state of the component mountings on the second boards Sb. As a result, even when the loading of the first board Sa2-1 has been completed, the component mountings on the second board Sb2-1 are continued until all of programmed or scheduled components are mounted thereon. Thereafter, the foregoing operations are repeated.

In this way, since the M-to-N rate mounting control is executed by switching, based on the numbers of the first and second boards Sa, Sb to be produced, the priority state between the first board priority state in which the component mountings are performed on the first boards Sa loaded to the first component mounting position on the priority basis over the second boards Sb loaded to the second component mounting position and the second board priority state in which the component mountings are performed on the second boards Sa loaded to the second component mounting position on the priority basis over the first boards Sa loaded to the first component mounting position, it is possible to produce the first boards Sa of M-sheets and the second boards Sb of N-sheets as, e.g., one unit.

Next, a second M-to-N rate mounting control will be described hereafter. The second M-to-N rate mounting control can be executed based on component mounting sequence data which has beforehand determined therein data regarding the kinds and mounting positions of components which are written in order of being mounted on the first and second boards Sa, Sb and data indicating timings at which the executions are started as to the loading and unloading of the first and second boards Sa, Sb with the first and second component mounting positions. That is, the controller 60 executes the component mounting sequence data which has recorded data for controlling the component placing device 40 in a series of component mounting operations which mount components on either one of the first and second boards Sa (or Sb), then mount components on both of the boards Sa, Sb and then mount components on the other boards Sb (or Sa), and data indicating timings at which the executions of the unloading and loading of the first or second boards Sa, Sb are to be started each time the mountings on each board Sa, Sb are completed. When data indicating the timing at which the execution of the unloading and loading of boards is to be started is read, the first or second board transfer device 10a, 10b performs the unloading and loading of the first or second boards Sa, Sb with the first or second component mounting position. During the unloading and loading of the boards, the component placing device 40 mounts the next component designated in the component mounting sequence data on the first or second board Sa, Sb which has been loaded to the first or second component mounting position and which is not being unloaded.

With reference to a time chart shown in FIG. 7, the second M-to-N rate mounting control will be described hereafter taking as example a case that the number M of the first boards Sa on which components are to be mounted are two sheets while the number N of the second boards Sb on which components are to be mounted are three sheets. The component mounting sequence data is for determining the mounting order in producing the first and second boards Sa, Sb of M+N sheets, and the same component mounting sequence data is repeated every M+N sheets. Further, the mounting order of components on the first and second board Sa, Sb in the component mounting sequence data are desirably determined taking the unloading and loading time for each board into consideration so that during the unloading and loading of either of the first and second boards, mountings are carried out on the other board. When a first-sheet first board Sa and a first-sheet second board Sb each of which is in a first group (hereafter designated as Sa1-1 and Sb1-1 respectively) are respectively loaded by the first and second board transfer devices 10a, 10b to the first and second component mounting positions, the component mountings on the second board Sb1-1 by the component placing device 40 are commanded and started (time t1).

When T1 (hereafter, T1-T5 represent sequence steps) is reached during the component mountings on the second board Sb1-1, component mountings by the component placing device 40 on the first board Sa1-1 are also commanded and started (time t2). When the component mountings on the second board Sb1-1 are completed (time t3), the same is unloaded by the second board transfer device 10b from the second component mounting position, and a second-sheet second board Sb in the first group (hereafter designated as Sb1-2) is loaded by the second board transfer device 10b to the second component mounting position. During the period from the unloading and loading of the second boards Sb1-1, Sb1-2 to T2 referred to later (time t3-t4), the component mountings by the component placing device 40 are continued on the first board Sa1-1.

When T2 is reached during the component mountings on the first board Sa1-1 (time t2-t5), the component mountings by the component placing device 40 on the second board Sb1-2 are also commanded and started (time t4). When the component mountings on the first board Sa1-1 are completed (time t5), the same is unloaded by the first board transfer device 10a from the first component mounting position, and a second-sheet first board Sb in the first group (hereafter designated as Sa1-2) is loaded by the first board transfer device 10a to the first component mounting position. During the period from the unloading and loading of the first boards Sa1-1, Sa1-2 to T3 referred to later (time t5-t6), the component mountings by the component placing device 40 are continued on the second board Sb1-2.

When T3 is reached during the component mountings on the second board Sb1-2, component mountings by the component placing device 40 on the first board Sa1-2 are also commanded and started (time t6). When the component mountings on the second board Sb1-2 are completed (time t7), the same is unloaded by the second board transfer device 10b from the second component mounting position, and a third-sheet second board Sb in the first group (hereafter designated as Sb1-3) is loaded by the second board transfer device 10*b* to the second component mounting position. During the period from the unloading and loading of the second boards Sb1-2, Sb1-3 to T4 referred to later (time t7-t8), the component mountings by the component placing device 40 are continued on the first board Sa1-2.

When T4 is reached during the component mountings on the first board Sb1-2 (time t6-t9), the component mountings by the component placing device 40 on the second board Sb1-3 are also commanded and started (time t8). When the component mountings on the first board Sa1-2 are completed (time t9), the same is unloaded by the first board transfer device 10*a* from the first component mounting position, and a first-sheet first board Sa in the next or second group (hereafter designated as Sa2-1) is loaded by the first board transfer device 10*a* to the first component mounting position. During the unloading and loading of the first boards Sa1-2, Sa2-1 (time t9-t10), the component mountings by the component placing device 40 are continued on the second board Sb1-3.

When the component mountings on the second board Sb1-3 are completed (time t10), the same is unloaded by the second board transfer device 10*b* from the second component mounting position. The foregoing operations complete one cycle for the component mountings on two first boards Sa and three second boards Sb. Then, a first-sheet second board Sb in the next or second group (hereafter designated as Sb2-1) is loaded by the second board transfer device 10*b* to the second component mounting position. During the unloading and loading of the second boards Sb1-3, Sb2-1 (time t10-t1), component mountings by the component placing device 40 are executed on the first board Sa2-1, and when T5 is reached, component mountings by the component placing device 40 on the second board Sb2-1 are also commanded and started (time t1). Thereafter, the foregoing operations (time t10, t1, t2 . . . , t10) are repeated.

As descried above, since the M-to-N rate mounting control is executed by controlling the component placing device 40 so that the component mountings are controlled based on the component mounting sequence data which includes the data regarding the kinds and mounting positions of the components which are written or programmed in order of being mounted on the first and second boards Sa, Sb, and the data indicating the timings at which the unloading and loading of the first and second boards Sa, Sb with the first and second component mounting positions are started to be executed, the component mounting frequencies at which component mountings are carried out on the first and second boards Sa, Sb can be set appropriately and finely as a unit of each sequence step. Therefore, it is possible to perform the component mountings on the first and second boards with the downtime of the apparatus reduced to the utmost, so that the efficiency in producing the first boards Sa of the M-sheets and the second boards Sb of the N-sheets can be enhanced greatly.

The foregoing production sequence data makes it possible to further enhance the production efficiency of the boards particularly where two component placing heads 43 are provided. The component mounting sequence data is prepared by an optimizing program which is designed to be able to enhance the production efficiency in component mounting operations. Thus, the component mounting sequence data which is capable of heightening the production efficiency can be obtained in a short period of time. It is however to be noted that the component mounting sequence data may be prepared by the operator.

Next, a third M-to-N rate mounting control will be described hereafter. The third M-to-N rate mounting control can be executed by controlling the loading and unloading of the first and second boards Sa, Sb. Specifically, the controller 60 individually prepares and executes as mounting programs a first board mounting program for controlling the component placing device 40 so that the component mountings on either of the first boards Sa and the second boards Sb, that is, on, e.g., the second boards Sb in a first group have priority over component mountings on the other boards, that is, on, e.g., the first boards Sa in a first group, a second board mounting program for controlling the component placing device 40 so that upon completion of the component mountings on the priority boards, that is, on, e.g., the second boards Sb in the first group, component mountings on the non-priority boards, that is, on, e.g., the first boards Sa in the first group have priority over component mountings on the priority boards, that is, on, e.g., the second boards Sb in a subsequent group, and a mounting program for controlling the first and second board transfer devices 10*a*, 10*b* which respectively transfer the first and second boards Sa, Sb and for turning mounting flags for the respective boards Sa, Sb to ON or OFF.

Figure 8:
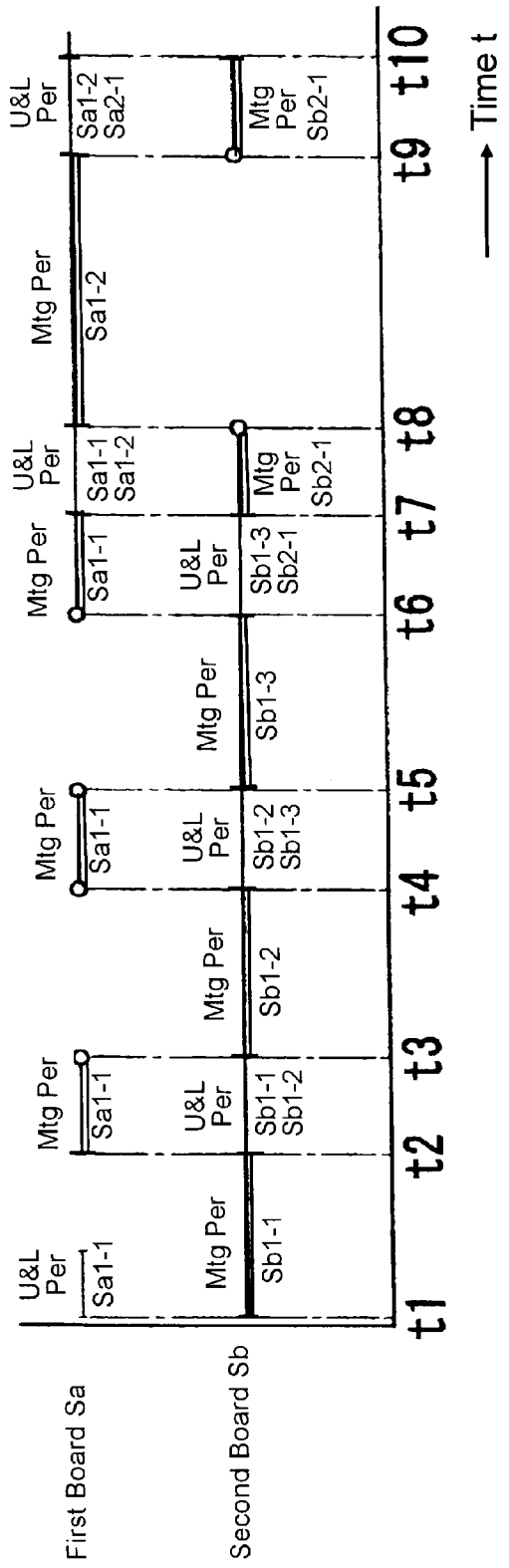
FIG. 8 is a time chart for explaining a third M-to-N mounting control executed by the controller shown in FIG. 4.
Figure 9:
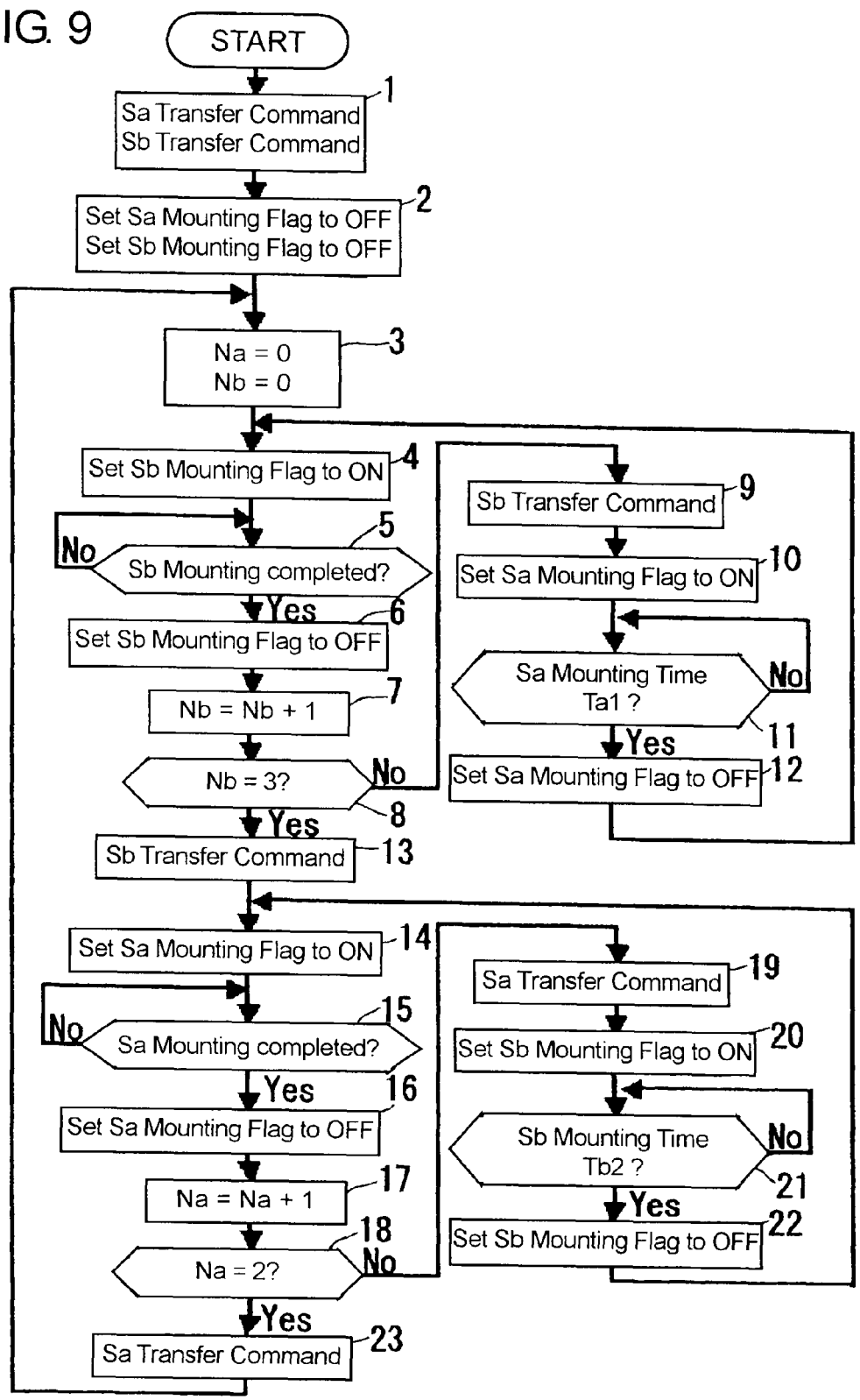
FIG. 9 is a flow chart for explaining the third M-to-N mounting control executed by the controller shown in FIG. 4.

With reference to a time chart shown in FIG. 8 and a flow chart shown in FIG. 9, the third M-to-N rate mounting control will be described hereafter taking as example a case that the number M of the first boards Sa on which components to be mounted are two sheets while the number N of the second boards Sb on which components to be mounted are three sheets. The loadings of a first-sheet first board Sa (hereafter designated as Sa1-1) and a first-sheet second board Sb (hereafter designated as Sb1-1) each of which is in a first group are commanded (step 1), and component mounting flags for the first board Sa1-1 and the second board Sb1-1 are set to OFF (step 2). Counts Na and Nb indicating respective sheet numbers of the first and second boards Sa, Sb are reset to "0" (step 3), and the component mounting flag for the second board Sb1-1 is set to ON (step 4).

When the second board Sb1-1 is loaded by the second board transfer device 10*b* to the second component mounting position, component mountings on the second board Sb1-1 are executed by the component replacing device 40 (time t1). Upon completion of the component mountings on the second board Sb1-1 (step 5, time t2), the component mounting flag for the second board Sb1-1 is set to OFF (step 6). The count Nb for the second board Sb has "1" added thereto (step 7), and judgment is made as to whether or not the count Nb for the second board Sb has reached "3" (step 8).

At this time, since the count Nb for the second board Sb is "1" and has not reached "3", the processing is advanced to step 9 to command the transfer of the second boards Sb, whereby the second board Sb1-1 is unloaded by the second board transfer device 10*b* from the second component mounting position, and then a second-sheet second board Sb in the first group (hereafter designated as Sb1-2) is loaded by the second board transfer device 10*b* to the second component mounting position (time t2-t3). At the same time, the component mounting flag for the first board Sa1-1 is set to ON (step 10), and component mountings on the first board Sa1-1 are performed by the component placing device 40 (time t2-t3). In this instance, the second board transfer device 10*b* is controlled to complete the loading of the second board Sb1-2 when the component mountings are completed to, for example, one third (⅓) of all of the component mountings to be performed on the first board Sa1-1.

After the component mountings by the component placing device 40 on the first board Sa1-1 are performed for time Ta1 (Yes at step 11), the component mounting flag for the first board Sa1-1 is set to OFF (step 12). Then, return is made to step 4 to set the component mounting flag for the second board Sb1-2 to ON, and the component mountings on the second board Sb1-2 are performed by the component placing device 40 (step 5, time t3). Upon completion of the component mountings on the second board Sb1-2 (step 5, time t4), the component mounting flag for the second board Sb1-2 is set to OFF (step 6). The count Nb for the second board Sb has "1" added thereto (step 7), and judgment is made as to whether or not the count Nb for the second board Sb has reached "3" (step 8).

At this time, since the count Nb for the second board Sb is "2" and has not reached "3", the processing is advanced to step 9 to command the transfer of the second boards Sb, whereby the second board Sb1-2 is unloaded by the second board transfer device 10b from the second component mounting position, and then a third-sheet second board Sb in the first group (hereafter designated as Sb1-3) is loaded by the second board transfer device 10b to the second component mounting position (time t4-t5). At the same time, the component mounting flag for the first board Sa1-1 is set to ON (step 10), and component mountings by the component placing device 40 are resumed and executed on the first board Sa1-1 on which the component mountings have been discontinued until then (time t4-t5). In this instance, the second board transfer device 10b is controlled to complete the loading of the second board Sb1-3 when the component mountings are completed to, for example, additional one third ($1/3$), that is, to two third ($2/3$) being the total including the preceding one third, of all of the component mountings to be performed on the first board Sa1-1.

After the component mountings by the component placing device 40 on the first board Sa1-1 are performed for time Ta1, the component mounting flag for the first board Sa1-1 is set to OFF (step 12). Then, return is made to step 4 to set the component mounting flag for the second board Sb1-3 to ON, and the component mountings on the second board Sb1-3 are performed by the component placing device 40 (time t5). Upon completion of the component mountings on the second board Sb1-3 (step 5, time t6), the component mounting flag for the second board Sb1-3 is set to OFF (step 6). The count Nb for the second board Sb has "1" added thereto (step 7), and judgment is made as to whether or not the count Nb for the second board Sb has reached "3" (step 8).

At this time, since the count Nb for the second board Sb has reached "3", the processing is advanced to step 13 to command the transfer of the second boards Sb, whereby the second board Sb1-3 is unloaded by the second board transfer device 10b from the second component mounting position, and then a first-sheet second board Sb in the next or second group (hereafter designated as Sb2-1) is loaded by the second board transfer device 10b to the second component mounting position (time t6-t7). At the same time, the component mounting flag for the first board Sa1-1 is set to ON (step 14), and the component mountings by the component placing device 40 are resumed and performed on the first board Sa1-1 on which the component mountings have been discontinued until then (time t6-t7). In this instance, the second board transfer device 10b is controlled to complete the loading of the second board Sb2-1 when the component mountings are completed to, for example, the remaining one third ($1/3$) of all of the component mountings to be performed on the first board Sa1-1.

Upon completion of the component mountings on the first board Sa1-1 (time t7), the component mounting flag for the first board Sa1-1 is set to OFF (step 16). The count Na for the first board Sa has "1" added thereto (step 17), and judgment is made as to whether or not the count Na for the first board Sa has reached "2" (step 18). At this time, since the count Na for the first board Sa is "1" and has not reached "2", the processing is advanced to step 19 to command the transfer of the first board Sa, whereby the first board Sa1-1 is unloaded by the first board transfer device 10a from the first component mounting position, and then a second-sheet first board Sa in the first group (hereafter designated as Sa1-2) is loaded by the first board transfer device 10a to the first component mounting position (time t7-t8). At the same time, the component mounting flag for the second board Sb2-1 is set to ON (step 20), and component mountings on the loaded second board Sb2-1 are performed by the component placing device 40 (time t7-t8). In this instance, the first board transfer device 10a is controlled to complete the loading of the first board Sa1-2 when the component mountings are completed to, for example, one second ($1/2$) of all of the component mountings to be performed on the second board Sb2-1.

After the component mountings by the component placing device 40 on the second board Sb2-1 are performed for time Tb2 (Yes at step 21), the component mounting flag for the second board Sb2-1 is set to OFF (step 22). Then, return is made to step 14 to set the component mounting flag for the first board Sa1-2 to ON, and the component mountings on the first board Sa1-2 are performed by the component placing device 40 (time t8). This time, the component mountings are continued until the first board Sa1-2 has all of components mounted thereon. Upon completion of the component mountings on the first board Sa1-2 (step 15, time t9), the component mounting flag for the first board Sa1-2 is set to OFF (step 16). The count Na for the first board Sa has "1" added thereto (step 17), and judgment is made as to whether or not the count Na for the first board Sa has reached "2" (step 18).

At this time, since the count Na for the first board Sa has reached "2", the processing is advanced to step 23 to command the transfer of the first boards Sa, whereby the first board Sa1-2 is unloaded by the first board transfer device 10a from the first component mounting position, and then a first-sheet first board Sa in the next or second group (hereafter designated as Sa2-1) is loaded by the first board transfer device 10a to the first component mounting position (time t9-t10). At the same time, return is made to step 3 to reset the sheet number counts Na, Nb for the first boards Sa and the second boards Sb to "0", and thereafter, the foregoing operations are repeated.

As described above, the M-to-N rate mounting control is executed by controlling the first and second board transfer devices 10a, 10b so that while the first board transfer device 10a loads the first boards Sa of the M-sheets to the first component mounting position, the second board transfer device 10b loads the second boards Sb of the N-sheets to the second component mounting position. Thus, the efficiency in producing the first boards Sa of the M-sheets and the second boards Sb of the N-sheets can be enhanced greatly.

In the foregoing embodiment, description has been made on the assumption that the first boards Sa of the M-sheets and the second boards Sb of the N-sheets are used in one and the same product. However, it is possible to simply apply the M-to-N rate mounting control to a case that the first boards Sa of the M-sheets and the second boards Sb of the N-sheets are produced as a unit without being limited to the use in one and the same product. Further, in the production of first and second child boards of two kinds, the M-to-N rate mounting control is also applicable to producing first boards Sa from each sheet of which first child boards of N-sheets can be made, and second board Sb from each sheet of which second child boards of M-sheets can be made.

Various features and many of the attendant advantages in the foregoing embodiment will be summarized as follows:

In the foregoing embodiment typically shown in FIGS. 1, 4, 5, 7 and 8, while performing the unloading and loading of either of the first and second boards Sa (or Sb), the controller 60 controls the component mountings on the other board Sb (or Sa). Thus, it is possible to effectively utilize the time which is taken for the loading and unloading of either of the first and second boards Sa (or Sb), and hence, the efficiency in mounting components on the other boards Sb (or Sa) can be enhanced, so that the efficiency in producing the boards can be enhanced. Further, since the controller 60 executes the M-to-N rate mounting control in which the component mountings are carried out on the second boards Sb of the N-sheets while the component mountings are carried out on the first boards Sa of the M-sheets, it is possible to suppress the occurrence of an intermediate stock of either of the first and second boards where the first boards of the M-sheets and the second boards of the N-sheets are required as, e.g., one unit or group.

Also in the foregoing embodiment typically shown in FIGS. 1, 4, 5 and 8, the controller 60 executes the M-to-N rate mounting control by switching, in dependence on the numbers of the first and second boards Sa, Sb to be produced, a first board priority state for component mountings on the first board Sa and a second board priority state for component mountings on the second board Sb, it is possible to produce the first boards of the M-sheets and the second boards of the N-sheets as, e.g., one unit or group.

Figure 7:
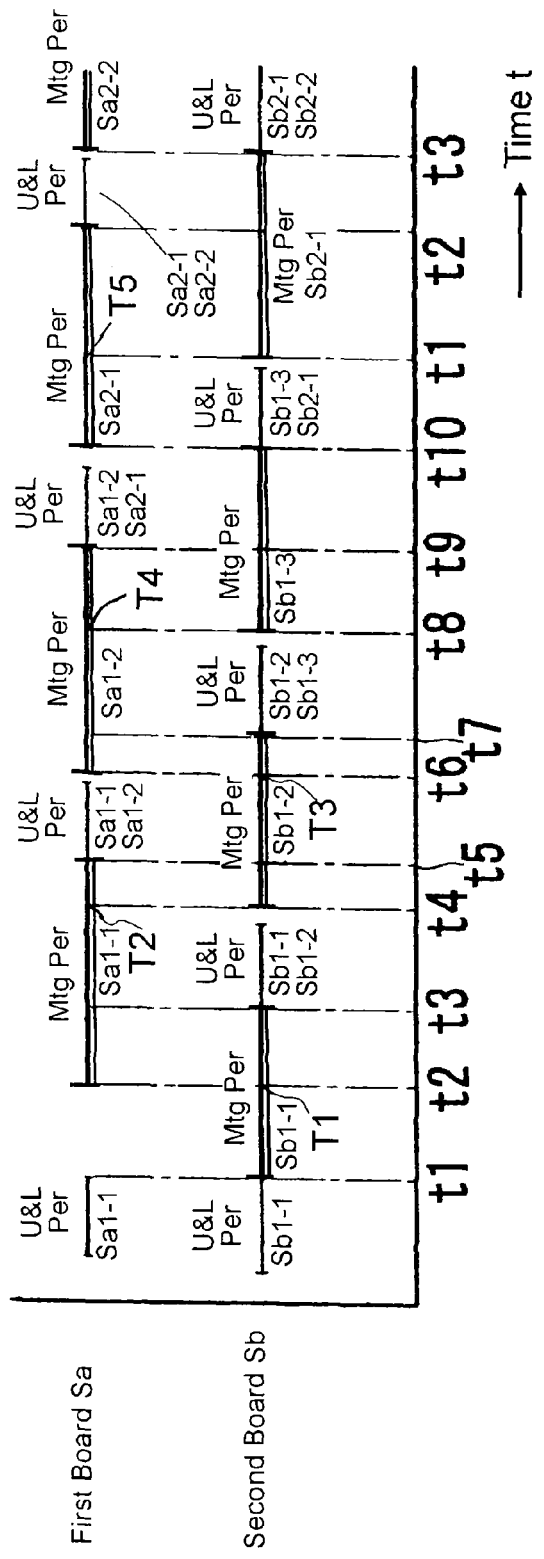
FIG. 7 is a time chart for explaining a second M-to-N mounting control executed by the controller shown in FIG. 4.

Also in the foregoing embodiment typically shown in FIGS. 1, 4 and 7, the controller 60 executes the M-to-N rate mounting control in accordance with the component mounting sequence data which includes data regarding the kinds and mounting positions of the components which are written in order of being mounted on the first and second boards Sa, Sb, and data indicating the timings at which the executions are started as to the unloading and loading of the first and second boards Sa, Sb with the first and second component mounting positions. Thus, the mountings of components on the first and second boards Sa, Sb can be performed in a manner of reducing the downtime of the apparatus to the utmost by making the frequencies of mounting the components on the first and second boards Sa, Sb appropriate, so that it is possible to greatly enhance the efficiency in producing the first boards Sa of the M-sheets and the second boards Sb of the N-sheets.

Also in the foregoing embodiment typically shown in FIGS. 1 and 4, since the component mounting sequence data is prepared by an optimizing program, it is possible to obtain the component mounting sequence date which is high in productive efficiency, within a short period of time.

Further, in the foregoing embodiment typically shown in FIGS. 1, 4, 5, 7 and 8, the controller 60 executes the M-to-N rate mounting control by loading the second boards Sb of the N-sheets while loading the first boards Sa of the M-sheets, it is possible to greatly enhance the efficiency in producing the first boards Sa of the M-sheets and the second boards Sb of the N-sheets.

Obviously, numerous further modifications and variations of the present invention are possible in light of the above teachings. It is therefore to be understood that within the scope of the appended claims, the present invention may be practiced otherwise than as specifically described herein.

What is claimed is:

1. A component mounting apparatus comprising:
   a first board transfer device for loading and unloading first boards with a first component mounting position;
   a second board transfer device for loading and unloading second boards with a second component mounting position;
   a component supply device for supplying components of plural kinds to be mounted on the first boards and the second boards;
   a component placing device including a component placing head for picking up the components from the component supply device to mount the components on the first and second boards, and a head moving mechanism for moving the component placing head in at least two directions parallel to surfaces of the first and second boards; and
   a controller for controlling operations of the first and second board transfer devices, the component supply device, and the component placing device;
   wherein the controller is configured to control the component placing device to mount the components on the first boards and the second boards at a rate of M-sheets to N-sheets, where M-sheets is a first number of the first boards and N-sheets is a second number of the second boards to be mounted during a mounting period and where M-sheets is not equal to N-sheets, by performing loading and unloading of the first boards by the first board transfer device with the first component mounting position and loading and unloading of the second boards by the second board transfer device with the second component mounting position, and
   wherein the controller is configured to operate, when one of the first and second board transfer devices is performing the unloading and loading of the boards with an associated one of the first and second component mounting positions, the component placing device to mount components on the other of the first or second board loaded by the other of the first and second board transfer devices to the other of the first and second component mounting positions and to execute an M-sheets to N-sheets rate mounting control to operate the first and second board transfer devices and the component placing device so that while the component placing device mounts the components on the first boards of the M-sheets at the first component mounting position, the component placing device mounts the components on the second boards of the N-sheets at the second component mounting position during the mounting period.

2. The component mounting apparatus as set forth in claim 1, wherein the controller is configured to execute the M-sheets to N-sheets rate mounting control by switching, in dependence on a total number of the first and second boards to be produced, a first board priority state in which the component placing device mounts the components on the first board loaded to the first component mounting position on a priority basis over the second board loaded to the second component mounting position, and a second board priority state in which the component placing device mounts the components on the second board loaded to the second component mounting position on a priority basis over the first board loaded to the first component mounting position.

3. The component mounting apparatus as set forth in claim 1, wherein the controller is configured to execute the M-sheets to N-sheets rate mounting control by controlling the component placing device to mount the components in accordance with component mounting sequence data which includes data regarding kinds and mounting positions of the components which are written in order of being mounted on the first and second boards, and data indicating timings at which the loading and unloading of the first and second boards with the first and second component mounting positions are started to be performed.

4. The component mounting apparatus as set forth in claim 3, wherein the component mounting sequence data is prepared by an optimizing program.

5. The component mounting apparatus as set forth in claim 1, wherein the controller is configured to execute the M-sheets to N-sheets rate mounting control by controlling the first and second board transfer devices so that while the first board transfer device loads the first boards of the M-sheets to the first component mounting position, the second board transfer device loads the second boards of the N-sheets to the second component mounting position.

6. The component mounting apparatus as set forth in claim 1, wherein when producing one unit of the first boards of the M-sheets and the second boards of the N-sheets, the controller is configured to control the first and second board transfer devices and the component placing device to mount the components concentrically on the second boards until the components mountings on all of the second boards of the N-sheets are completed except, for unloading and loading of the second boards during which time component mountings are performed on the first board, and then to perform mount the components concentrically on the first boards of the M-sheets prior to starting component mountings on the second boards of the N-sheets in a subsequent unit.

7. The component mounting apparatus as set forth in claim 1, wherein when the controller is configured to execute the M-sheets to N-sheets rate mounting control for each mounting period, a number of the first boards produced and a number of the second boards produced is reset to zero, wherein the controller is configured to select the second board priority state and increments the number of the second boards produced by one when the mounting of the components on one of the second boards is completed, wherein, when the number of the second boards produced is equal to the N-sheets, the controller is configured to select the first board priority state and increments the number of the first boards produced by one when the mounting of the components on one of the first boards is completed, and wherein, when the number of the first boards produced is equal to the M-sheets, the controller selects the second board priority state.

8. The component mounting apparatus as set forth in claim 7, wherein the controller is configured to repeat the M-sheets to N-sheets rate mounting control for each subsequent mounting period until a total number of the first boards and the second boards to be produced is completed, and wherein the total number of first boards is greater than M-sheets and the total number of second boards is greater than N-sheets.

* * * * *